(12) United States Patent
Mao et al.

(10) Patent No.: US 9,088,215 B2
(45) Date of Patent: Jul. 21, 2015

(54) POWER CONVERTER PACKAGE STRUCTURE AND METHOD

(75) Inventors: Hengchun Mao, Plano, TX (US); Dianbo Fu, Richardson, TX (US); Bing Cai, Richardson, TX (US)

(73) Assignee: Futurewei Technologies, Inc., Plano, TX (US)

( * ) Notice: Subject to any disclaimer, the term of this patent is extended or adjusted under 35 U.S.C. 154(b) by 1078 days.

(21) Appl. No.: 13/156,203

(22) Filed: Jun. 8, 2011

(65) Prior Publication Data

US 2012/0313595 A1 Dec. 13, 2012

(51) Int. Cl.
*H05K 7/00* (2006.01)
*H02M 3/158* (2006.01)
*H02M 3/00* (2006.01)

(52) U.S. Cl.
CPC .............. *H02M 3/1588* (2013.01); *H02M 3/00* (2013.01); *Y02B 70/1466* (2013.01); *Y10T 29/4913* (2015.01)

(58) Field of Classification Search
CPC ... H02M 3/00; H02M 3/1588; Y02B 70/1466
USPC ......... 361/723, 767, 760–764, 768, 781–783; 257/676, 686, 685
See application file for complete search history.

(56) References Cited

U.S. PATENT DOCUMENTS

| | | |
|---|---|---|
| 5,621,635 A | 4/1997 | Takiar |
| 6,184,585 B1 | 2/2001 | Martinez et al. |
| 6,762,067 B1 | 7/2004 | Quinones et al. |
| 6,943,455 B1 | 9/2005 | Maxwell |
| 7,129,577 B2 | 10/2006 | Maxwell |
| 7,230,333 B2 | 6/2007 | Standing |
| 7,253,506 B2 | 8/2007 | Keating |
| 7,405,467 B2 | 7/2008 | Liu et al. |
| 7,551,455 B2 | 6/2009 | Chen et al. |
| 7,851,897 B1 | 12/2010 | Cate et al. |
| 2004/0125573 A1* | 7/2004 | Joshi et al. ..................... 361/723 |
| 2005/0057228 A1* | 3/2005 | Shih .............................. 323/222 |
| 2005/0063488 A1* | 3/2005 | Troyk et al. ................... 375/316 |
| 2008/0252372 A1* | 10/2008 | Williams ...................... 330/251 |
| 2010/0176508 A1 | 7/2010 | Herbsommer et al. |
| 2012/0063038 A1* | 3/2012 | Yin et al. ........................ 361/18 |
| 2013/0125393 A1* | 5/2013 | You ................................ 29/840 |
| 2014/0091449 A1* | 4/2014 | Fernando et al. ............. 257/676 |

OTHER PUBLICATIONS

Delta Electronics, Inc., D1251R830B, Non-Isolated, Power Block DC/DC Power Modules: 7.0~13.2Vin, 08V~1.8V/30Aout, Datasheet, Jan. 23, 2009, pp. 1-15.
Ericsson, ROA 128 3003 Power Block, Input 7-13.2 V, Output up to 30 a/82 W, Technical Specification, EN/LZT 146 402 R1B Apr. 2009, pp. 1-13.

* cited by examiner

Primary Examiner — Yuriy Semenenko
(74) Attorney, Agent, or Firm — Slater & Matsil, L.L.P.

(57) ABSTRACT

An embodiment power converter package comprises a semiconductor die, an output inductor, a plurality of input capacitors and output capacitors. The semiconductor die, the output inductor and the plurality of capacitors are mounted on a lead frame and connected one to another through various pads on the lead frame. The semiconductor die comprises a high side switch, a low side switch and a driver. The power converter package is electrically coupled to an external pulse width modulation controller through a variety of input and output pads.

18 Claims, 6 Drawing Sheets

POWER CONVERTER PACKAGE STRUCTURE AND METHOD

TECHNICAL FIELD

The present invention relates generally to non-isolated dc-dc converters and methods, and more particularly to non-isolated dc-dc converters and methods employing an integrated power converter package.

BACKGROUND

A telecommunication network power system usually includes an ac-dc stage converting the power from the ac utility line to a 48V dc distribution bus and a dc-dc stage converting the 48V dc distribution bus to a plurality of voltage levels for all types of telecommunication loads. Alternatively, the 48V dc distribution bus may be converted into a low voltage bus through an isolated dc-dc converter. Furthermore, a plurality of downstream non-isolated dc-dc converters with inputs coupled to the low voltage bus may generate a variety of voltage levels in accordance with the needs of the telecommunication network power system.

Non-isolated dc-dc converters can be implemented by using different power topologies, such as buck converters, boost converters, buck-boost converters, linear regulators and/or the like. As known in the art, buck converters are widely employed to convert the intermediate bus to various voltage levels required by down stream circuits in a telecommunication system.

SUMMARY OF THE INVENTION

Technical advantages are generally achieved by embodiments of the present invention which provide a system, structure and method for reducing the size of a dc-dc switching converter.

In accordance with an embodiment, a structure comprises a first semiconductor die mounted on a lead frame, an inductor mounted on the lead frame wherein the inductor is coupled to the first semiconductor die through a plurality of power pads on the lead frame, a plurality of input capacitors mounted on the lead frame wherein the plurality of input capacitors are coupled to the first semiconductor die and a plurality of output capacitors mounted on the lead frame wherein the plurality of output capacitors are coupled to the first semiconductor die.

The structure further comprises a plurality of small signal capacitors mounted on the lead frame wherein the plurality of small signal capacitors is coupled to the first semiconductor die. The structure also comprises a plurality of small signal resistors mounted on the lead frame wherein the plurality of small signal resistors is coupled to the first semiconductor die. The first semiconductor die comprises a high side switch, a low side switch and a driver. Alternatively, the structure comprises a second semiconductor die and a third semiconductor die. The second semiconductor die is stacked on top of the first semiconductor die through a plurality of metal bumps.

In accordance with another embodiment, a system comprises a plurality of power blocks and a controller coupled to the plurality of power blocks. Each power block comprises a first semiconductor die mounted on a lead frame comprising an inductor mounted on the lead frame wherein the inductor is coupled to the first semiconductor die through a plurality of power pads on the lead frame, a plurality of input capacitors mounted on the lead frame wherein the plurality of input capacitors are coupled to the first semiconductor die, and a plurality of output capacitors mounted on the lead frame wherein the plurality of output capacitors are coupled to the first semiconductor die.

In accordance with yet another embodiment, a method comprises mounting a first semiconductor die on a lead frame, mounting an inductor on the lead frame wherein the inductor is coupled to the first semiconductor die through a plurality of power pads, mounting a plurality of input capacitors on the lead frame and mounting a plurality of output capacitors on the lead frame. The method further comprises embedding a regulator into the first semiconductor die wherein the regulator is selected from the group consisting of a buck converter, a linear regulator, and a switching capacitor regulator.

The method further comprises mounting a second semiconductor die on the lead frame and mounting a third semiconductor die on the lead frame. The second semiconductor die is mounted on top of the first semiconductor die. The method further comprises connecting a resistor between two signal inputs of the first semiconductor die, adjusting a delay between two gate drive signals of a buck converter embedded in the first semiconductor die, reporting a current flowing through a buck converter embedded in the first semiconductor die and reporting a junction temperature of the first semiconductor die.

An advantage of an embodiment of the present invention is reducing the form factor of a buck converter so as to improve the efficiency, reliability of an on-board power system.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise

DETAILED DESCRIPTION OF ILLUSTRATIVE EMBODIMENTS

Figure 1:
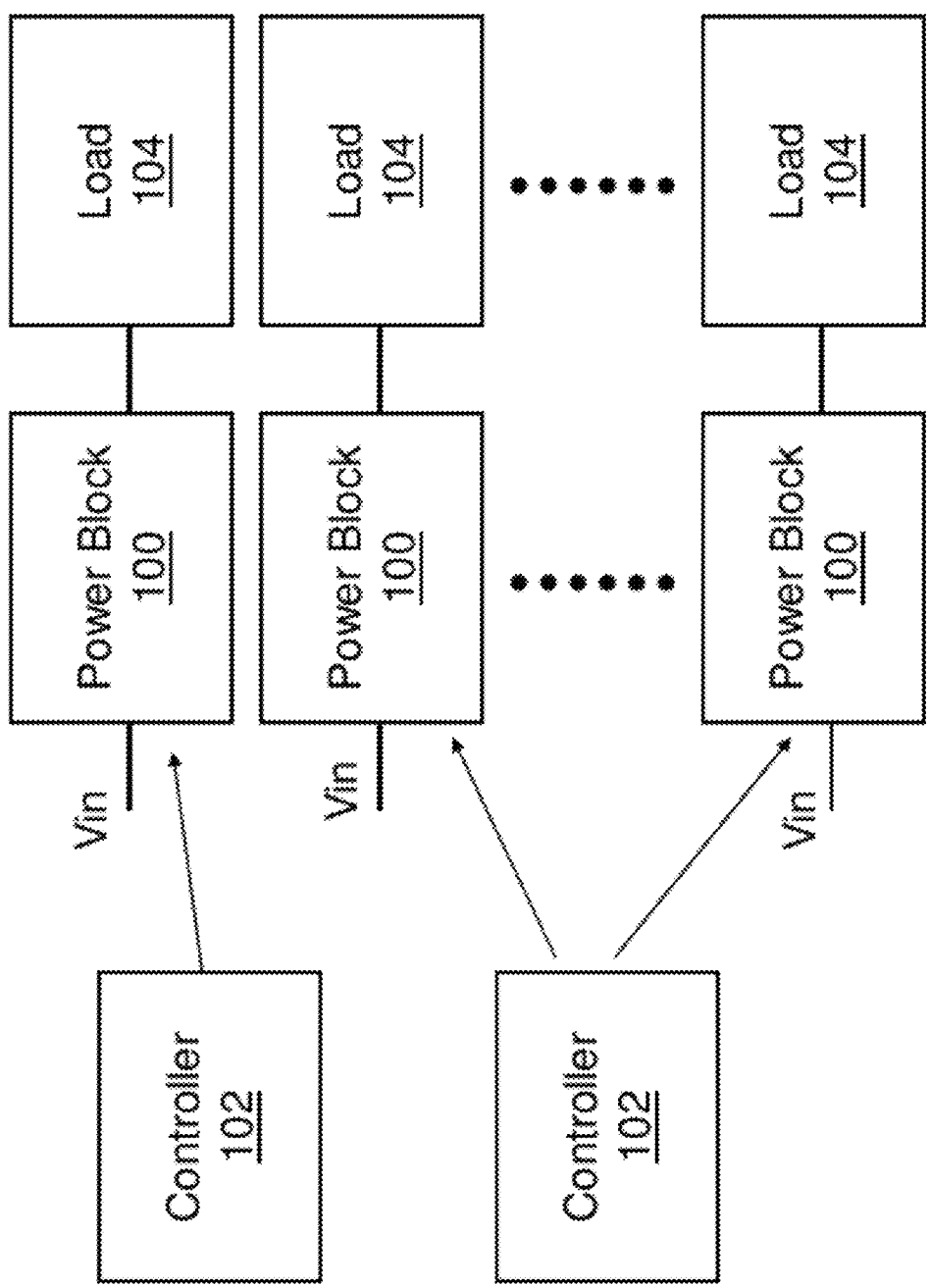
FIG. 1 illustrates a block diagram of a power conversion scheme for providing regulated voltages in accordance with an embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a buck dc-dc converter having a high integration package. The invention may also be applied, however, to a variety of dc-dc converters including buck converters, boost converters, buck-boost converters, flyback converters, forward converters, half bridge and full bridge converters and the like.

A buck converter may comprise a high side switch, a low side switch, a magnetic field storage component such as an inductor and an input electric field storage component such as an input capacitor and an output electric field storage component such as an output capacitor formed by a plurality of capacitors connected in parallel. In accordance with the operation principles of buck converters, the high side switch and the low side switch operate in a complementary mode. The ratio of the conduction time of the high side switch over the switching period of a buck converter is referred to as the duty cycle of the buck converter. The duty cycle is set by a PWM controller or the like.

In a telecommunication network power system, buck dc-dc converters may be implemented by different power structures. A buck dc-dc converter may comprise pre-packaged semiconductor devices, such as power metal-oxide-semiconductor field-effect transistors (MOSFETs), MOSFET gate drivers and PWM controllers. In addition, the buck dc-dc converter may comprise various passive components such as input and output power capacitors and power inductors. All components of the buck dc-dc converter may be connected one to another by various PCB traces. However, the parasitic inductance produced by the PCB traces may cause significant power losses when the buck dc-dc converter operates at a high switching frequency. As semiconductor technologies evolve, different levels of package integration may be employed to reduce power losses so that a buck converter can achieve higher efficiency. The package integration of dc-dc regulators can be divided into three major categories: switchers with integrated MOSFETs, integrated driver MOSFET (DrMOS) power blocks and system-on-a-chip buck converters.

A switcher with integrated MOSFETs may comprise a pair of MOSFETs, a MOSFET driver and a pulse width modulation (PWM) controller. A DrMOS power block, as indicated by its name, may comprise a pair of MOSFET switches and the corresponding driver. A system-on-a-chip buck converter may comprise all major components of a buck converter such as a pair of switches, a driver, input and output capacitors, an inductor and a PWM controller. As indicated by its name, a single chip can provide all functions of a buck converter. On-board solutions show various advantages in comparison with power modules. However, these integration methods may have some drawbacks. For example, the first two methods mentioned above may have significant power losses because some passive components such as inductors are not included in the package. The third method may not provide application flexibility because the controller and its associated components are integrated into the package.

Referring initially to FIG. 1, a block diagram of a power conversion scheme for providing regulated voltages is illustrated in accordance with an embodiment. In response to the detected voltages (not shown) at the outputs of a plurality of power blocks 100, a controller 102 is capable of generating a variety of control signals used to control the operation of each power block 100. The controller 102 may employ a variety of power converter control schemes such as current mode control, voltage mode control, hysteresis control, any combination thereof and the like. The controller 102 may control a power block 100. Alternatively, the controller 102 may control a plurality of power blocks 100 to form a multi-phase converter or a multi-output converter. Each power block 100 has an input coupled to a bus voltage Vin. In accordance with an embodiment, the bus voltage Vin is a regulated voltage of 12V, which is generated by an isolated dc-dc converter (not shown) from a 48V telecommunication bus (not shown). The power block 100 has an output coupled to a load 104. Depending on the voltages from the power block 100, the load 104 may be a core processor, a field-programmable gate array (FPGA), a memory circuit, general purpose input/output circuits and the like. The detailed schematic diagram of the power block 100 will be described below with respect to FIGS. 2 and 3.

It should be noted that while FIG. 1 illustrates a plurality of power blocks 100 operating independently between the input bus Vin and various loads 104, this block diagram is merely an example, which should not unduly limit the scope of the claims. One of ordinary skill in the art would recognize many variations, alternatives, and modifications that are within the scope of the present invention. For example, a plurality of power blocks 100 may be stacked together so that a higher output voltage can be achieved. On the other hand, a plurality of power blocks 100 may operate in parallel so that the output of the plurality of power blocks 100 may supply a high current to the load 104.

Figure 2:
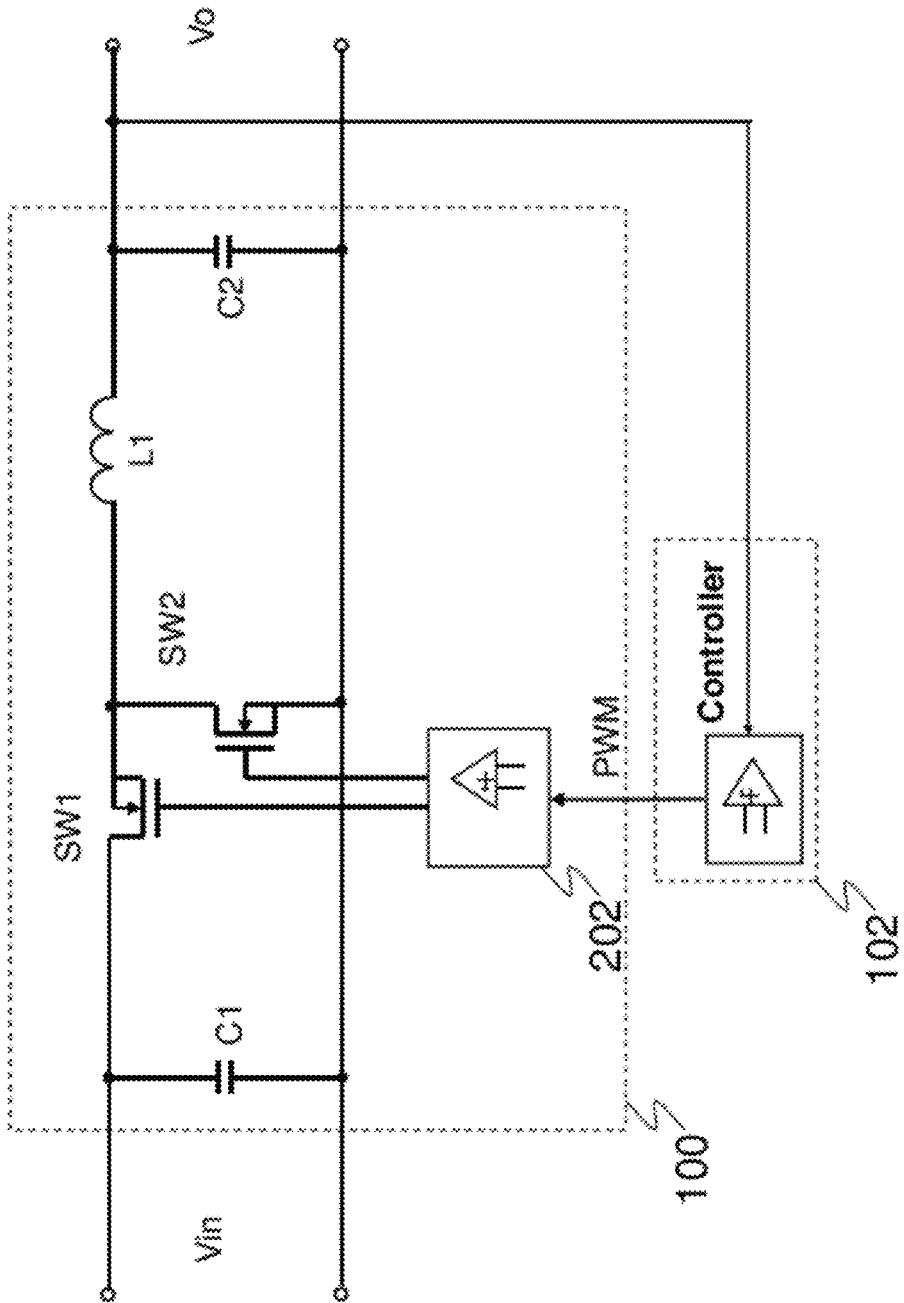
FIG. 2 illustrates a schematic diagram of the power block shown in FIG. 1.

FIG. 2 illustrates a schematic diagram of the power block 100 shown in FIG. 1. A buck converter may comprise passive components such as capacitors, active components such as MOSFET switches, a driver 202 and a controller 102. The controller 102 may see a deterioration in performance when the operation temperature of the controller is elevated to a high level. In order to maintain a favorable operation condition for the controller 102, the majority of the buck converter shown in FIG. 2 except the controller 102 is fabricated on a single lead frame. By separating the power train from the controller 102, the controller 102 may operate reliably even if the temperature of the power block 100 is elevated to a higher level. The implementation of fabricating the power block 100 on a lead frame will be illustrated in detail with respect to FIGS. 4 and 5. In sum, an advantageous feature of this configuration is that the separation between the power block 100 and the controller 102 helps to prevent thermal stress from affecting the controller 102. In addition, the separation between the power block 100 and the controller 102 provides application flexibility for a system designer to optimize system performance.

The power block 100 may comprise an input capacitor C1, an output capacitor C2, a high side switch SW1, a low side switch SW2, an inductor L1 and a driver 202. As shown in FIG. 2, the input capacitor C1 is coupled between two terminals of the input bus. In accordance with an embodiment, the input capacitor C1 is a ceramic capacitor having a range from 0.1 uF to 100 uF. It should be recognized that while FIG. 1 illustrates a power block 100 with one input capacitor, the power block 100 could accommodate any number of capacitors. A person having ordinary skill in the art will recognize that one input capacitor is illustrated for simplicity. Likewise, the output capacitor C2 is coupled between two terminals of the output of the power block 100. In accordance with an embodiment, the output capacitor C2 is a ceramic capacitor having a range from 1 uF to 100 uF.

As shown in FIG. 2, both high side switch SW1 and low side switch SW2 are n-type metal oxide semiconductor (NMOS) transistors. The high side switch SW1 has a drain coupled to the positive terminal of the input bus, and a source coupled to the drain of the low side switch SW2. It should be noted that the junction point between the high side switch SW1 and the low side switch SW2 is commonly referred to as the phase of a buck dc-dc converter. As shown in FIG. 2, both the gates of the high switch SW1 and the low side switch SW2 are controlled by the controller 102 through the driver 202. The driver 202 can amplify the small signal control signals from the controller 102 to a higher level so that both the high side switch SW1 and the low side switch SW2 can turn on or off sharply to avoid unnecessary switching losses. The driver 202 is powered by the input voltage Vin (not shown but illustrated in FIG. 3).

Figure 3:
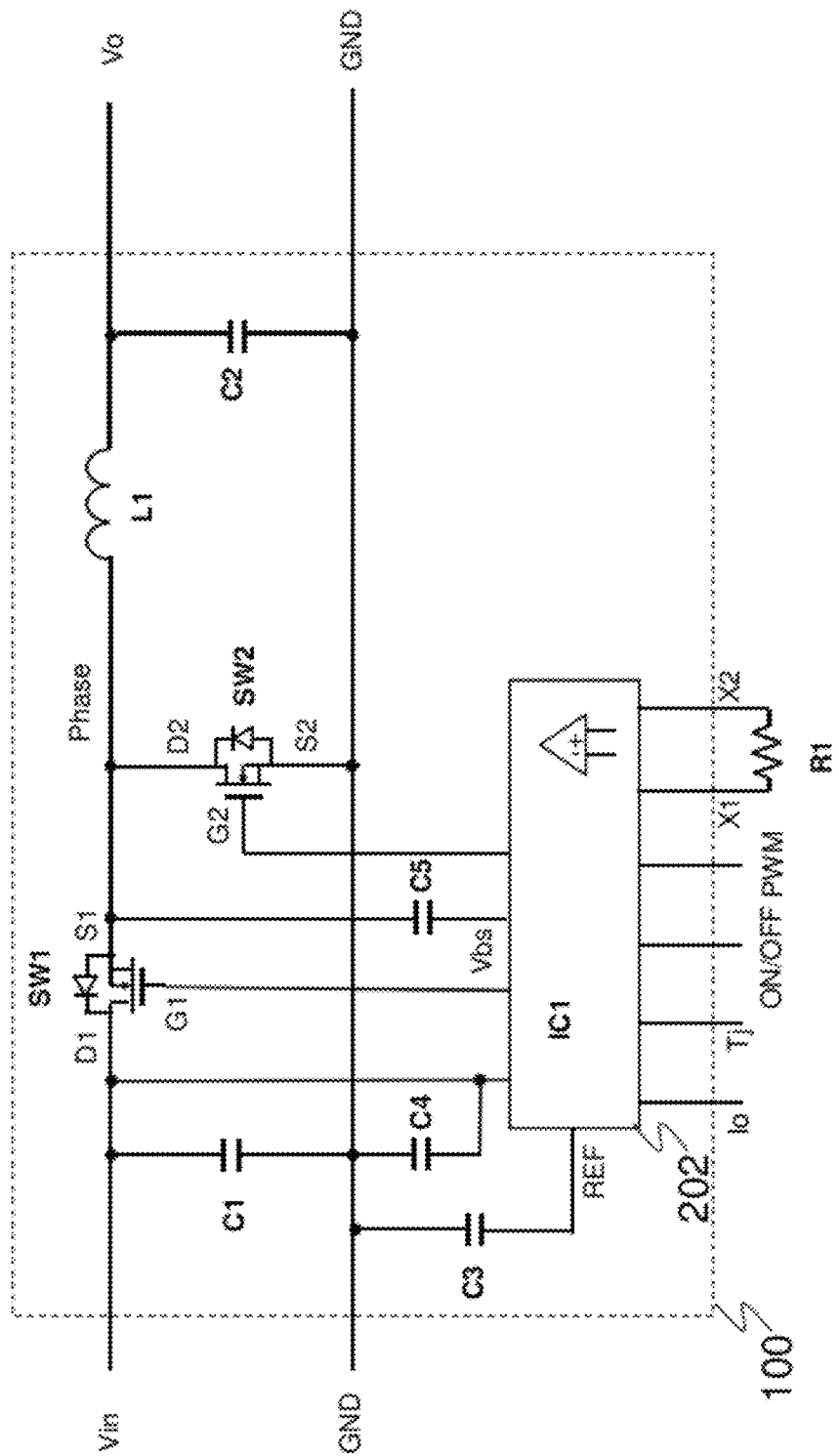
FIG. 3 illustrates in further detail a schematic diagram of the power block shown in FIG. 2.

FIG. 3 illustrates in further detail a schematic diagram of the power block 100 shown in FIG. 2. The power block 100 may comprise three power terminals, namely Vin, Vo and GND. In addition, the power block 100 comprises a variety of signal terminals including Io, Tj, ON/OFF, PWM, X1 and X2. The power block 100 may be able to measure the current flowing through the power block and report the measured current value through the signal terminal Io. Furthermore, the power block 100 is capable of reporting the junction temperature of the power block 100.

In accordance with an embodiment, the power block 100 may employ a monolithic semiconductor die. In other words, the high side switch SW1, the low side switch SW2 and the driver 202 may be fabricated on a single semiconductor die. The driver 202 may comprise a temperature detection circuit to detect the junction temperature of the monolithic semiconductor die and report the junction temperature through the signal terminal Tj to an external thermal management unit (not shown). The ON/OFF signal terminal is used to control the operation of the power block 100. In response to an enable signal applied to the ON/OFF signal terminal, the power block enters an active mode in which both the high switch SW1 and the low side switch SW2 are controlled by the PWM signal from the controller 102 (illustrated in FIG. 2). On the other hand, when a disable signal is applied to the ON/OFF terminal, both the high side switch SW1 and the low side switch SW2 are shut down immediately.

FIG. 3 further illustrates a variety of features of the power block 100. As shown in FIG. 3, the power block 100 may comprise two control terminals X1 and X2. An external resistor R1 is coupled between control terminals X1 and X2. By employing the resistor R1 having different values, the operation parameters such as the delay time between two gate drive signals of the high side switch SW1 and the low side switch SW2 may be adjusted accordingly. Alternatively, the resistor R1 can be used to adjust the current sense gain. It should be noted while FIG. 3 illustrates the resistor R1 is placed outside the power block 100, the resistor R1 may be integrated into the power block 100. It should further be noted that FIG. 3 illustrates only six signal terminals of the power block 100 that may include a variety of signal terminals. The number of signal terminals illustrated herein is limited solely for the purpose of clearly illustrating the inventive aspects of the various embodiments. The present invention is not limited to any specific number of signal terminals.

FIG. 3 further illustrates other features of the power block 100. The power block 100 may comprise a reference voltage REF. In accordance with an embodiment, the reference voltage REF is of a 5V voltage. In order to generate a 5V reference voltage, the power block 100 may comprise an auxiliary power converter (included as part of driver 202). The auxiliary power converter may be implemented by a buck dc-dc converter, a linear regulator, a switching capacitor regulator, any combination thereof and the like. The operation principles of linear regulators and switching capacitor regulators are well known in the art, and hence are not discussed in further detail to avoid repetition.

The power block 100 may comprise a variety of on-chip capacitors. As shown in FIG. 3, a capacitor C3 is placed between the reference voltage REF and ground. In accordance with an embodiment, the capacitor C3 may be a ceramic capacitor having a capacitance range from 0.1 uF to 10 uF. The capacitor C3 is used to attenuate noise so that the reference voltage REF remains constant with different operation and temperature variations. Similarly, a capacitor C4 may be placed between the Vin terminal of the driver 202 and ground. The capacitor C4 helps to prevent switching noise from interfering with the operation of the driver 202. Likewise, the capacitor C4 is a ceramic capacitor having a range from 0.1 uF to 10 uF.

The power block 100 further comprises a bootstrap capacitor C5. As shown in FIG. 3, the high side switch SW1 is an NMOS transistor. In order to reliably turn on the high side switch SW1, the gate drive voltage at G1 should be higher than Vin. Such a higher voltage can be generated by a bootstrap capacitor. The bootstrap capacitor is coupled to Vin via a diode or a controlled switch built in the driver 202. When the phase of the buck converter is low, the bootstrap capacitor C5 is charged up to a voltage level approximately equal to Vin. When the phase of the buck converter goes high, the voltage across the capacitor C5, which is approximately equal to Vin, can be used by the driver 202 to drive the high side switch SW1. The capacitor C5 may be a ceramic capacitor having a range from 0.01 uF to 10 uF, preferably 1 uF.

Figure 4:
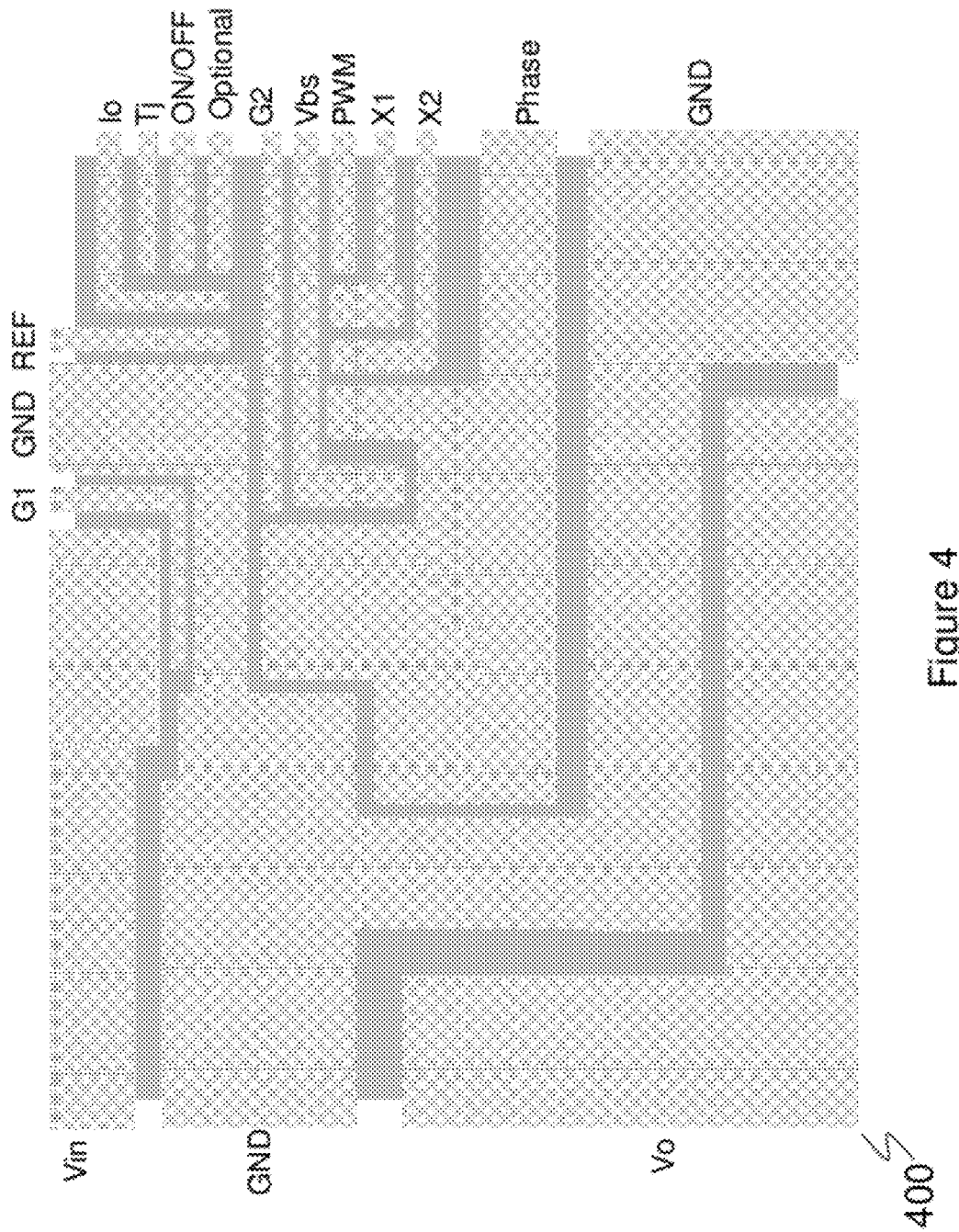
FIG. 4 illustrates a lead frame in accordance with an embodiment.

FIG. 4 illustrates a lead frame in accordance with an embodiment. The lead frame 400 is formed of thermally and electrically conductive materials. The lead frame pattern shown in FIG. 4 may be fabricated using a stamping and etching process. The process of fabricating the lead frame 400 is not discussed in further detail herein to avoid repetition as it is well know in the art. The lead frame 400 comprises a variety of pads. The pads can be divided into two groups: signal pads and power pads. As shown in FIG. 4, the power pads comprise Vin, Vo, GND and Phase. The signal pads may comprise G1, G2, REF, Io, Tj, ON/OFF, Optional, Vbs, PWM, X1 and X2.

It should be noted that the shapes of the power pads and signal pads in FIG. 4 are merely an example, which should not unduly limit the scope of the claims. One of ordinary skill in the art would recognize many variations, alternatives, and modifications within the scope of the present invention. For example, other shapes such as oval or circular are within the scope of the present disclosure. It should further be noted while FIG. 4 illustrates a variety of small signal functions and the corresponding small signal pads on the lead frame 400, a person skilled in the art will recognize that the lead frame 400 is merely an example. In consideration of the needs of a buck dc-dc converter, the small signal pads can be added, removed, replaced and rearranged.

Figure 5:
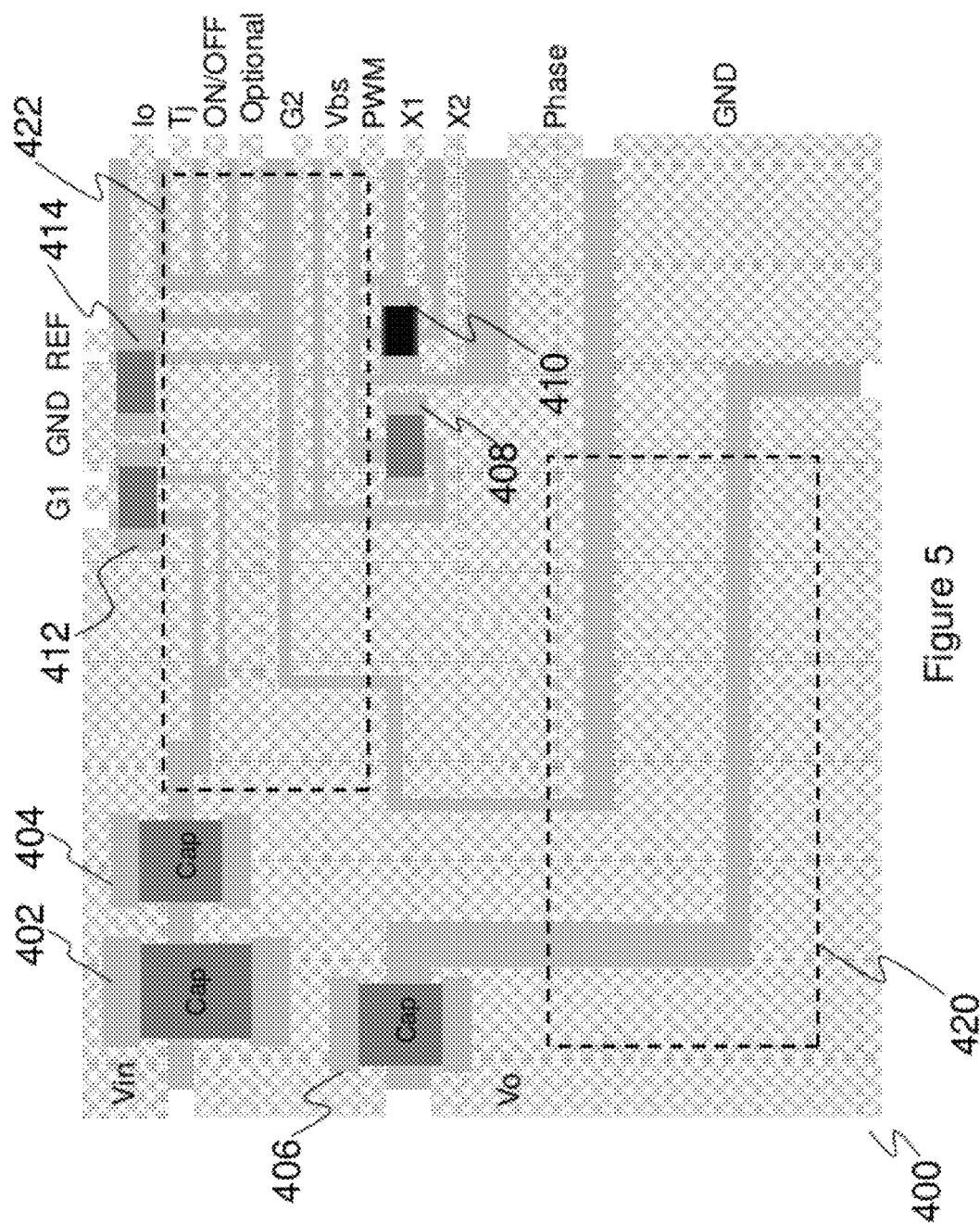
FIG. 5 illustrates a monolithic semiconductor die mounted on a lead frame and a variety of passive components mounted on the same lead frame.

FIG. 5 illustrates a monolithic semiconductor die mounted on the lead frame 400, and a variety of passive components mounted on the same lead frame. The monolithic die 422 may be mounted on the lead frame 400 using conductive adhesive or high temperature solder. More particularly, high temperature solder may be printed on the lead frame 400 using a stencil in consideration of electrical connection needs. Then, the monolithic semiconductor die 422 is attached to the lead frame 400 through the solder bumps between the monolithic semiconductor die 422 and the power pads on the lead frame 400. The electrical connections between the monolithic semiconductor die 422 and the lead frame 400 are done through the solder bumps. Alternatively, a person having ordinary skill in the art will recognize that the electrical connections between the monolithic semiconductor die 422 and the lead frame 400 can be done using wire bonding.

FIG. 5 further illustrates various passive components mounted on the lead frame 400. As shown in FIG. 5, an inductor 420 is mounted on the lead frame 400 through the power pad Vo and the power pad Phase. A plurality of input capacitors such as 402 and 404 are mounted on the lead frame 400 through the power pad Vin and the power pad GND. Likewise, an output capacitor 406 is mounted between the power pad Vo and the power pad GND. Furthermore, there may be various small signal capacitors mounted on the small signal pads. The small signal capacitors are connected between different signal paths. More particularly, a capacitor 412 is mounted next to the Vin terminal of the monolithic semiconductor die 422 for attenuating noise interference. Similarly, a capacitor 414 is mounted between the small signal pad REF and GND to keep the reference voltage REF constant during different operation conditions.

A bootstrap capacitor 408 is mounted between the small signal pad Vbs and the power pad Phase. A resistor 410 is mounted between the small signal pads X1 and X2. It should be noted that while FIG. 5 illustrates the resistor 410 is mounted on the lead frame 400, one skilled in the art will recognize that mounting a resistor on the lead frame is simply one manner of adjusting operating parameters of the buck dc-dc converter and that other and alternate embodiments could be employed (such as employing an external resistor) and that other solutions, (e.g., a digital control signal from a digital controller to the monolithic semiconductor die 422, etc.) could be employed for this function.

Figure 6:
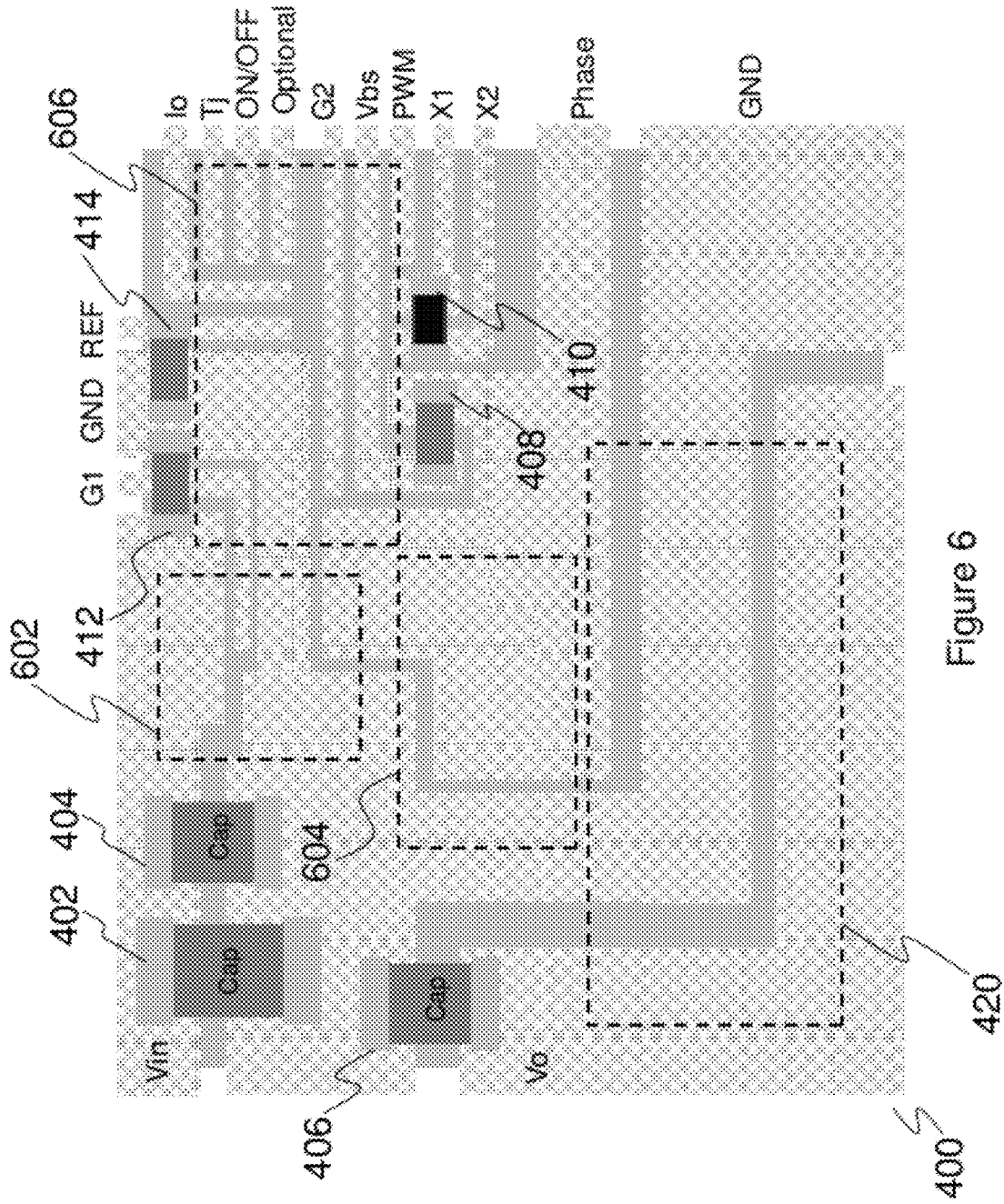
FIG. 6 illustrates three semiconductor dies mounted on a lead frame and a variety of passive components mounted on the same lead frame.

FIG. 5 illustrates a buck dc-dc converter using a monolithic die. While it is understood that the buck dc-dc converter may employ multiple semiconductor dies, one monolithic semiconductor die is illustrated for simplicity. For example, FIG. 6 illustrates a buck dc-dc converter having three semiconductor dies. By slightly modifying the lead frame 400, the buck dc-dc converter may employ three semiconductor dies, namely a first semiconductor die 602 for a high side switch, a second semiconductor die 604 for a low side switch and a third semiconductor die 606 for a driver. In addition, in order to further reduce the size of the lead frame 400, the first semiconductor die 602 may be stacked on top of the second semiconductor die 604 using metal bumps placed between them. Alternatively, the first semiconductor die 602 may be stacked on top of the second semiconductor die 604 using metal clips. The first semiconductor die 602 and the second semiconductor die 604 may be further connected with the lead frame using bonding wires.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure comprising:
    a first semiconductor die mounted on a lead frame, wherein the first semiconductor die is electrically coupled to a regulator controller located outside the structure, wherein the first semiconductor die comprises:
        a high side switch comprising:
            a first drain coupled to the plurality of input capacitors;
            a first gate coupled to a driver; and
            a first source;
        a low side switch comprising:
            a second drain coupled to the first source;
            a second gate coupled to the driver; and
            a second source coupled to ground; and
        the driver comprising:
            an input terminal coupled to the regulator controller located outside the structure; and
            various outputs coupled to the high side switch and the low side switch;
    an inductor mounted on the lead frame, wherein the inductor is coupled to the first semiconductor die through a plurality of power pads on the lead frame;
    a plurality of input capacitors mounted on the lead frame, wherein the plurality of input capacitors are coupled to the first semiconductor die; and
    a plurality of output capacitors mounted on the lead frame, wherein the plurality of output capacitors are coupled to the first semiconductor die.

2. The structure of claim 1, wherein the plurality of output capacitors and the inductor form an output filter.

3. The structure of claim 1, wherein the plurality of input capacitors are configured to maintain a dc voltage at an input terminal of the structure.

4. The structure of claim 1, further comprising:
    a plurality of small signal capacitors mounted on the lead frame, wherein the plurality of small signal capacitors are coupled to the first semiconductor die; and
    a plurality of small signal resistors mounted on the lead frame, wherein the plurality of small signal resistors are coupled to the first semiconductor die.

5. The structure of claim 1, wherein the first semiconductor die comprises circuitry converting an input voltage to a reference voltage, wherein the reference voltage is used to provide a reference voltage level for a driver in the first semiconductor die.

6. The structure of claim 5, wherein the circuitry is a regulator selected from the group consisting of a buck converter, a linear regulator, and a switching capacitor regulator.

7. A structure comprising:
    a semiconductor die on a lead frame, wherein the semiconductor die is electrically coupled to a controller, wherein the semiconductor die comprises:

a high side switch comprising:
  a first drain coupled to the plurality of input capacitors;
  a first gate coupled to a driver; and
  a first source;
a low side switch comprising:
  a second drain coupled to the first source;
  a second gate coupled to the driver; and
  a second source coupled to ground; and
the driver comprising:
  an input terminal coupled to the regulator controller located outside the structure; and
  various outputs coupled to the high side switch and the low side switch;
an inductor on the lead frame, wherein the inductor is coupled to the semiconductor die through a phase pad on the lead frame;
a plurality of input capacitors on the lead frame, wherein the plurality of input capacitors are coupled to the semiconductor die; and
a plurality of output capacitors on the lead frame, wherein the plurality of output capacitors are coupled to the semiconductor die.

8. The structure of claim 7, wherein:
the plurality of input capacitors are coupled between a Vin pad and a ground pad.

9. The structure of claim 7, wherein:
the plurality of output capacitors are coupled between a Vo pad and a ground pad.

10. The structure of claim 7, further comprising:
a reference capacitor coupled to a reference pad of the lead frame.

11. The structure of claim 7, further comprising:
a bootstrap capacitor coupled to the phase pad of the lead frame.

12. The structure of claim 7, wherein:
the semiconductor die comprises switches of a buck dc-dc converter.

13. The structure of claim 7, wherein:
the semiconductor die is mounted on the lead frame through a conductive adhesive material.

14. A structure comprising:
a semiconductor die on a lead frame, wherein the semiconductor die comprises:
  a high side switch comprising:
    a first drain coupled to the plurality of input capacitors;
    a first gate coupled to a driver; and
    a first source;
  a low side switch comprising:
    a second drain coupled to the first source;
    a second gate coupled to the driver; and
    a second source coupled to ground; and
  the driver comprising:
    an input terminal coupled to the regulator controller located outside the structure; and
    various outputs coupled to the high side switch and the low side switch;
an inductor on the lead frame, wherein the inductor is coupled to the semiconductor die through a phase pad on the lead frame;
a plurality of input capacitors on the lead frame, wherein the plurality of input capacitors are coupled to the semiconductor die; and
a plurality of output capacitors on the lead frame, wherein the plurality of output capacitors are coupled to the semiconductor die.

15. The structure of claim 14, wherein:
the lead frame is formed of thermally and electrically conductive materials.

16. The structure of claim 14, wherein:
the lead frame is formed through a stamping and etching process.

17. The structure of claim 14, wherein:
the lead frame comprises a plurality of small signal pads.

18. The structure of claim 14, wherein:
the lead frame comprises a plurality of power pads.

* * * * *